United States Patent [19]
Kawai

[11] Patent Number: 5,198,388
[45] Date of Patent: Mar. 30, 1993

[54] METHOD OF FORMING INTERCONNECTION PATTERNS

[75] Inventor: Kenji Kawai, Hyogo, Japan

[73] Assignee: Mitsubishi Denki Kabushiki Kaisha, Tokyo, Japan

[21] Appl. No.: 616,273

[22] Filed: Nov. 20, 1990

[30] Foreign Application Priority Data

Jul. 4, 1990 [JP] Japan .................. 2-178289

[51] Int. Cl.⁵ .......................... H01L 21/283
[52] U.S. Cl. ...................... 437/173; 437/190; 437/192; 437/197; 437/228; 156/643
[58] Field of Search ............ 29/884; 148/DIG. 19, 148/DIG. 20, DIG. 131; 156/643; 437/190, 192, 197, 228, 173

[56] References Cited

U.S. PATENT DOCUMENTS

| | | | |
|---|---|---|---|
| 4,490,211 | 12/1984 | Chen et al. | 437/173 |
| 4,668,335 | 5/1987 | Mockler et al. | 156/643 |
| 4,678,536 | 7/1987 | Murayama et al. | 156/635 |
| 4,738,869 | 4/1988 | Baumgartner | 437/173 |
| 4,954,423 | 9/1990 | McMann et al. | 156/643 |
| 4,957,880 | 9/1990 | Itoh et al. | 437/173 |
| 4,964,940 | 10/1990 | Auvert et al. | 156/643 |
| 4,967,152 | 10/1990 | Patterson | 156/643 |
| 4,980,020 | 12/1990 | Douglas | 156/643 |

FOREIGN PATENT DOCUMENTS

| | | |
|---|---|---|
| 0099558 | 2/1984 | European Pat. Off. . |
| 0175561 | 3/1986 | European Pat. Off. . |
| 0247603 | 12/1987 | European Pat. Off. . |
| 0316835 | 5/1989 | European Pat. Off. . |
| 3410023A1 | 9/1984 | Fed. Rep. of Germany . |

OTHER PUBLICATIONS

Article entitled "Photon Stimulated Gas Desorption from Pure Aluminum", Iwata et al., J. Vac. Sci. Technol. A, vol. 6, No. 3, May/Jun. 1988.
Article entitled "Effects of Ti Interlevel Existence in Al/Ti/TiN/Ti Structure for Highly Reliable Interconnection", by Maeda et al., VLSI Symposium, 1985.
Ikawa et al., "Si Surface Treatment Using Deep UV Irradiation," Proceedings of Symposium on Dry Process, Oct. 24–25, 1985, pp. 25–29.

Primary Examiner—Olik Chaudhuri
Assistant Examiner—Ourmazd S. Ojan
Attorney, Agent, or Firm—Lowe, Price, LeBlanc & Becker

[57] ABSTRACT

Disclosed is a method which enables a sufficient anti-corrosion processing of an interconnection pattern. An interconnection layer is formed on a semiconductor substrate. The interconnection layer is selectively etched by employing a halogen-type gas, so as to form an interconnection pattern. The interconnection pattern is irradiated with deep UV light in a vacuum of $1 \times 10^{-4}$ Torr or less in degree. Even if a protection film including halogen is formed on the side wall of the interconnection pattern upon reactive ion etching, this method enables sufficient removal of the halogen in a sufficient time and a complete anti-corrosion processing of the interconnection pattern.

12 Claims, 4 Drawing Sheets

5,198,388

METHOD OF FORMING INTERCONNECTION PATTERNS

BACKGROUND OF THE INVENTION

1. Field of the Invention

The present invention relates generally to a method of forming interconnection patterns and, more particularly, to an improved method of forming interconnection patterns which enables prevention of corrosion of metal interconnections.

2. Description of the Background Art

In a process of manufacturing a semiconductor device, the step of forming interconnection patterns is an indispensable processing step. FIGS. 4A and 4B are cross-sectional views showing the interconnection pattern forming step.

Referring to FIG. 4A, a gate 31 and an interlayer insulation film 32 are formed on a semiconductor substrate 30. A contact hole 33b for exposing source/drain regions (not shown) of a transistor and a contact hole 33a for exposing a portion of a surface of gate 31 are formed in interlayer insulation film 32. A barrier metal 40 such as TiN or the like is formed on interlayer insulation film 32 so as to coat the side wall and the bottom of contact holes 33a and 33b. An interconnection layer 34 made of an aluminum alloy film is formed on barrier metal 40 to fill contact holes 33a and 33b.

The reasons for formation of barrier metal 40 are as follows. That is, Si of 1–5% is in general mixed in interconnection layer 34 of the aluminum alloy film. Accordingly, if no barrier metal 40 is formed, an Al atom transfers from interconnection layer 34 to semiconductor substrate 30 (silicon substrate), and a Si atom transfers from semiconductor substrate 30 into interconnection layer 34. The transfer of the atoms causes defects in interconnection layer 34. Thus, barrier metal 40 is necessary.

A resist 35 patterned in a predetermined form is formed on interconnection layer 34.

An interconnection pattern 36 is formed by selectively etching interconnection layer 34 with resist 35 used as a mask, with reference to FIGS. 4A and 4B.

As a conventional method of forming interconnection patterns of aluminum alloy, such a method has been provided that interconnection layer 34 of aluminum alloy is subjected to a wet etching process with a mixed solution of phosphoric acid, nitric acid, etc. by employing resist 35. This method, however, has difficulties in formation of a micropattern of 3 μm or less due to an enhanced etching extending beneath resist pattern 35, a so-called under-cutting. Thus, a method employing a reactive ion etching (hereinafter referred to as RIE etching) using a gas of chlorine or a compound containing chlorine, e.g., $Cl_2$, $SiCl_4$, $BCl_3$, etc. has been adopted for formation of such a micropattern.

A description will be given in detail on the conventional method of forming an interconnection pattern by the RIE etching process and further on disadvantages of the method.

Referring to FIG. 5A, a lower insulator film 2 is formed on a semiconductor substrate 1. A barrier metal 3 such as TiN is formed on lower insulator film 2. A metal interconnection layer 4 such as of AlSi, AlSiCu, Mg and so on is then formed on barrier metal 3. A resist pattern 5 of a predetermined form is formed on metal interconnection layer 4.

With reference to FIGS. 5A and 5B, metal interconnection layer 4 and barrier metal 3 undergo the reactive ion etching by employing a halogen-type gas including chlorine such as $Cl_2$, $SiCl_4$, $BCl_3$ and so on, with resist pattern 5 used as mask. This reactive ion etching causes metal interconnection layer 4 and barrier metal 3 to be selectively etched, resulting in formation of an interconnection pattern 4a. At this time, a protection film 6 including halogen is formed on the side walls of resist pattern 5 and interconnection pattern 4a. This protection film 6 serves to suppress isotropic etching and enhance anisotropy. Protection film 6 containing halogen is made by a complicated reaction of components in the resist, interconnection layer and halogen-type gas.

Then, resist 5 is removed by etching, to complete the formation of the interconnection pattern. However, when this semiconductor device is taken out in the atmosphere with protection film 6 adhering thereto, there occurs a problem that interconnection pattern 4a becomes corroded and then disconnected.

The causes of the corrosion and disconnection of interconnection pattern 4a are as follows. That is, protection film 6 includes halogen, e.g., chlorine, and hence when exposed in the atmosphere, the film reacts with water molecules in the atmosphere and generates hydrochloric acid. This hydrochloric acid acts on interconnection pattern 4a to produce a reaction product (e.g., a metal chloride). When this reaction product becomes separated from the side wall of interconnection pattern 4a, interconnection pattern 4a becomes gradually corroded.

In order to prevent the corrosion of the interconnection pattern, such a processing method has conventionally been proposed that Cl is substituted for F by a plasma processing employing a plasma of a fluorine-type gas such as of $CF_4$, $CHF_3$ and so on, with reference to FIG. 5C.

However, the above-described plasma processing employing the gas of $CF_4$ or the like causes the side wall of barrier metal 3 such as TiN to be etched (hereinafter referred to as side-etch), as shown in FIG. 5C. Thus, it has been impossible to carry out the plasma processing in a sufficient time. That is, sufficient anti-corrosion processing of interconnection pattern 4a has not been accomplished in this method, leading to disconnections of interconnection pattern 4a and to a degradation in reliability of interconnections.

SUMMARY OF THE INVENTION

One object of the present invention is therefore to provide a method that enables sufficient anti-corrosion processing of an interconnection pattern.

Another object of the present invention is to provide a method that enables sufficient anti-corrosion processing of an interconnection pattern in a short time.

A further object of the present invention is to provide a method that enables an enhancement in margin of anti-corrosion processing of an interconnection pattern.

A still further object of the present invention is to provide an interconnection pattern forming method that enables an enhancement in reliability of a semiconductor device.

In an interconnection pattern forming method according to the present invention, an interconnection layer is first formed on a semiconductor substrate. The interconnection layer is selectively etched by employing a halogen-type gas, so as to form an interconnection pattern. The interconnection pattern is irradiated with ultraviolet rays in a vacuum of $1\times 10^{-4}$ Torr or less in degree.

Accordingly, even if a protection film including halogen is formed on the side wall of the interconnection pattern upon reactive ion etching, the halogen is excited by an application of ultraviolet-ray energy. Then, the coupling of the protection film and halogen is cleaved, and the halogen is released from the protection film. In this ultraviolet-ray processing, such inconvenience that the barrier metal is side-etched does not occur as in the conventional plasma processing method employing the gas of $CF_4$ or the like. This makes it possible to sufficiently remove the halogen which results in corrosion of the interconnection pattern in a sufficient time and then to perform a perfect anti-corrosion processing of the interconnection pattern.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
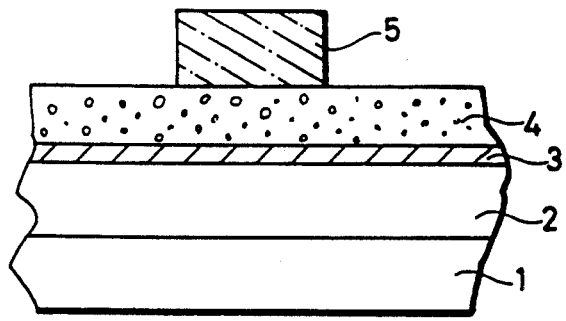
FIGS. 1A–1C are cross-sectional views showing processing steps according to one embodiment of the present invention.
Figure 1B:
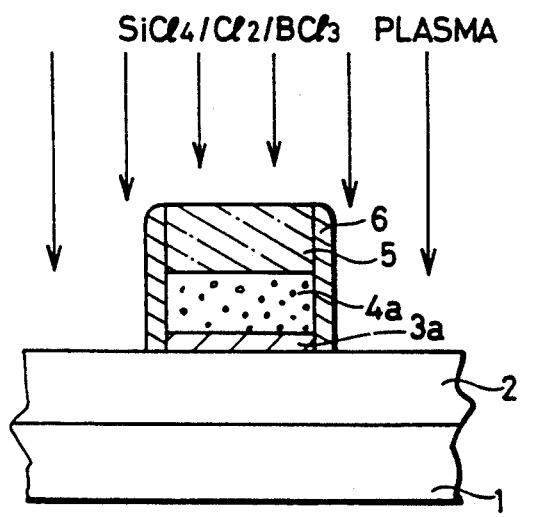
Figure 1C:
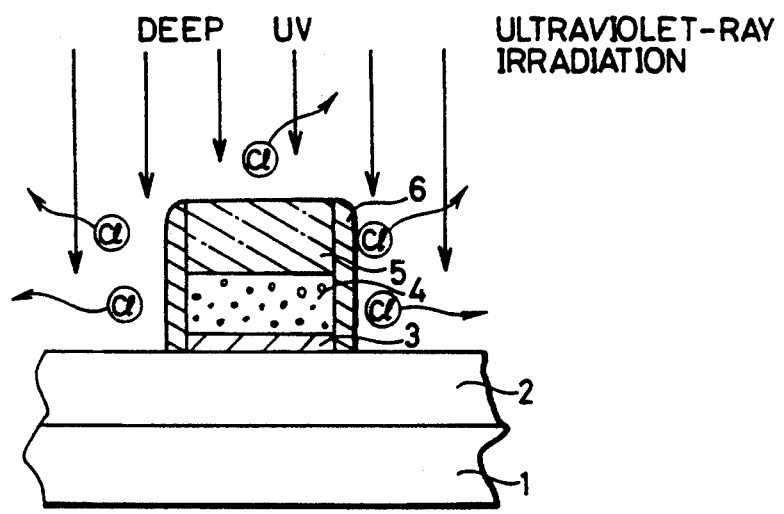
Figure 2:
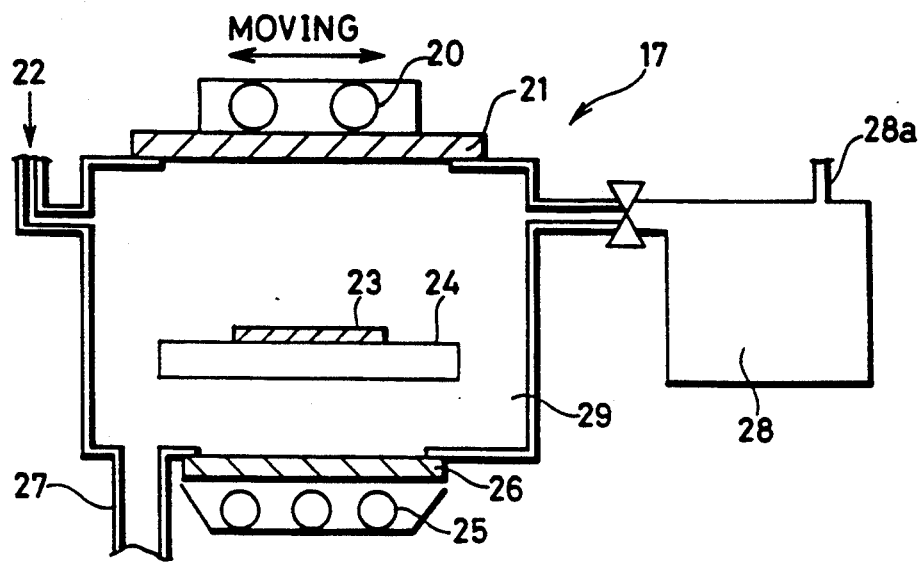
FIG. 2 is a conceptional diagram of a photoreaction chamber employed in the present invention.

FIG. 2 shows a detailed structure of a photoreaction chamber for implementing the step shown in FIG. 1C.

A description will be given on the detailed structure of the photoreaction chamber with reference to FIG. 2 before a description on the processing steps of FIGS. 1A–1C. A photoreaction chamber 17 comprises a processing chamber 29 for carrying out a surface treatment of a semiconductor substrate 23 with light in high vacuum. A sample plate 24 for placing semiconductor substrate 23 thereon is provided in processing chamber 29. Processing chamber 29 includes a gas inlet 22 for introducing a gas for the surface treatment with light. Processing chamber 29 further includes a gas outlet 27 for putting processing chamber 29 in a high vacuum state. A plasma generation chamber 28 for generating a plasma by a microwave discharge or the like is connected to processing chamber 29. Plasma generation chamber 28 includes a gas inlet 28a for introducing a gas into plasma generation chamber 28. An ultraviolet light source 20 for emitting deep UV light is disposed at a position outside processing chamber 29 and opposing to sample plate 24. Processing chamber 29 has a window 21 to make ultraviolet rays emitted from ultraviolet light source 20 enter processing chamber 29. An infrared lamp 25 serving as a light source for heating a sample is disposed beneath processing chamber 29. Processing chamber 29 has a window 26 for introducing infrared rays emitted from infrared lamp 25 into processing chamber 29.

A description will now be given on a method of forming an interconnection pattern on a semiconductor substrate with reference to FIGS. 1A–1C and 2.

Referring to FIG. 1A, a lower insulator film 2 is formed on a semiconductor substrate 1. A barrier metal 3 such as TiN is then formed on lower insulator film 2. A metal interconnection layer 4 is formed on barrier metal 3. Metal interconnection layer 4 is formed of a metal such as AlSi, AlSiCu, Cu, Mg or the like. A resist pattern 5 is formed on metal interconnection layer 4.

With reference to FIG. 1B, metal interconnection layer 4 and barrier metal 3 are subjected to a reactive ion etching by employing a plasma of a halogen-type gas, e.g., a mixed gas of $SiCl_4/Cl_2/BCl_3$, with resist pattern 5 used as mask. This reactive ion etching causes a selective etching of metal interconnection layer 4 and barrier metal 3, resulting in formation of an interconnection pattern 4a. A protection film 6 including halogen (Cl) is formed on the side walls of resist pattern 5, interconnection pattern 4a and a barrier metal pattern 3a during the reactive ion etching.

Semiconductor substrate 23 having the interconnection pattern formed thereon is placed on sample plate 24, with reference to FIG. 2. A gas is exhausted through gas outlet 27, to maintain processing chamber 29 in a high vacuum of $1\times 10^{-6}$ Torr or less. Ultraviolet light source 20 is turned on to introduce the deep UV light into processing chamber 29. This state is shown in FIG. 1C. The halogen (Cl) contained in protection film 6 is excited by an energy of the deep UV light, with reference to FIG. 1C. The coupling of protection film 6 and the halogen is cleaved, and then the halogen (Cl) is released from protection film 6. In this ultraviolet-ray processing, such inconvenience that barrier metal 3 is side-etched does not occur as in the conventional plasma processing employing the $CF_4$ gas. This makes it possible to sufficiently remove the halogen (Cl) which causes corrosion of interconnection pattern 4a in a sufficient time and to carry out a complete anti-corrosion processing of the interconnection pattern. This method has an advantage of enhancing margin of the anti-corrosion processing of interconnection pattern 4a.

While the description has been given on the case that processing chamber 29 is kept in the vacuum of $1\times 10^{-6}$ Torr or less in degree and then irradiated with the deep UV light in the foregoing embodiment, the present invention is not limited to this. A gas including fluorine (e.g., $CF_4$) may be introduced through gas inlet 22 into processing chamber 29 and then irradiated with ultraviolet rays. In this case, however, processing chamber 29 cannot in general maintain a degree of vacuum at $1\times 10^{-4}$ Torr or less. Such an effect is provided that processing time can be reduced by employing the gas including fluorine.

Moreover, a plasma of a gas including active fluorine may be formed in plasma generation chamber 28 to introduce the plasma into processing chamber 29 in place of the introduction of the gas including fluorine through gas inlet 22.

While the employment of deep UV light for ultraviolet rays has been shown as an example in the foregoing embodiment, the present invention is not limited to this. Any lights having wavelengths of 300 nm or less can be employed.

In addition, although no particular limitation has been placed on the intensity of irradiation of ultraviolet rays in the foregoing embodiment, the intensity of ultraviolet-ray irradiation is preferably 50 mW/cm$^2$ or more.

Furthermore, although no specific limitations have been placed on the temperature of the semiconductor substrate upon irradiation of ultraviolet rays in the foregoing embodiment, the semiconductor substrate is preferably kept at a temperature of 30°-50° C.

Figure 3:
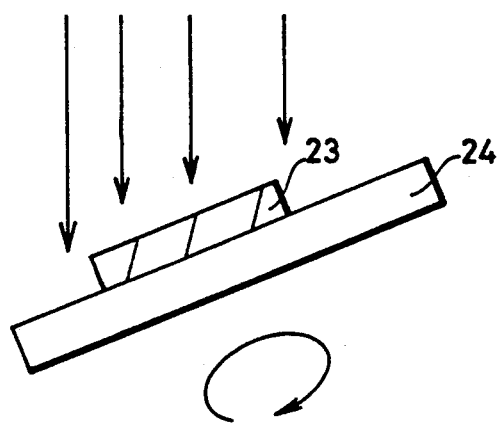
FIG. 3 is a cross-sectional view of another embodiment of the present invention.
Figure 4A:
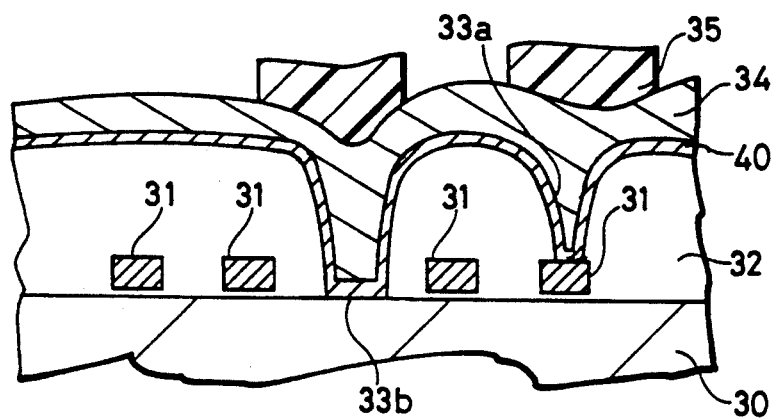
FIGS. 4A and 4B are cross-sectional views showing a known interconnection pattern forming step, which is one step of a manufacture process of a semiconductor device.
Figure 4B:
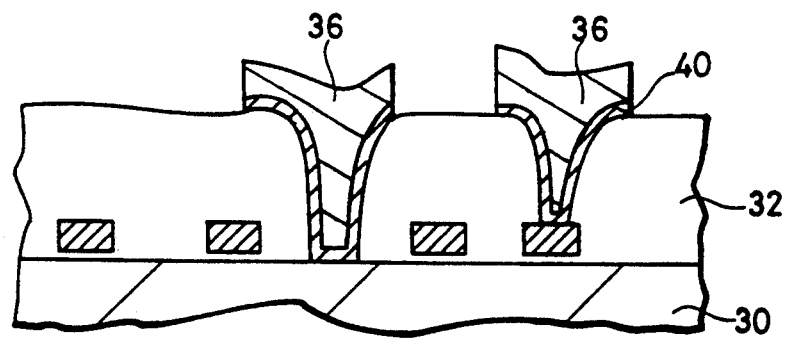
Figure 5A:
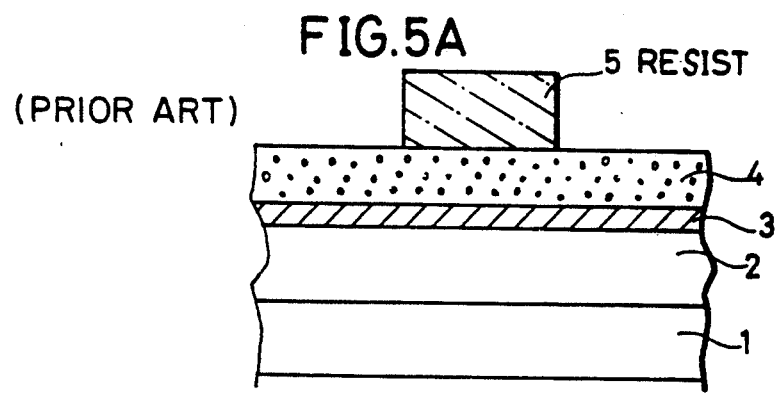
FIGS. 5A–5C are cross-sectional views showing conventional steps of forming interconnection patterns and disadvantages of the steps.
Figure 5B:
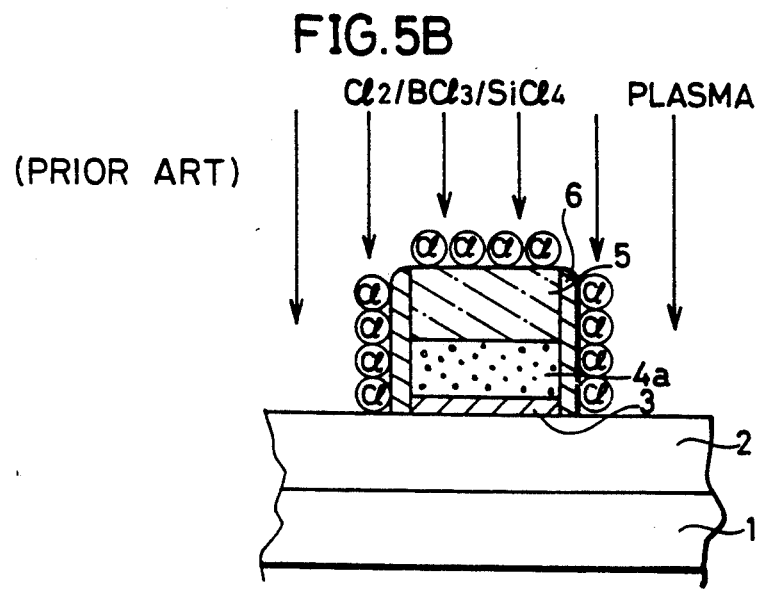
Figure 5C:
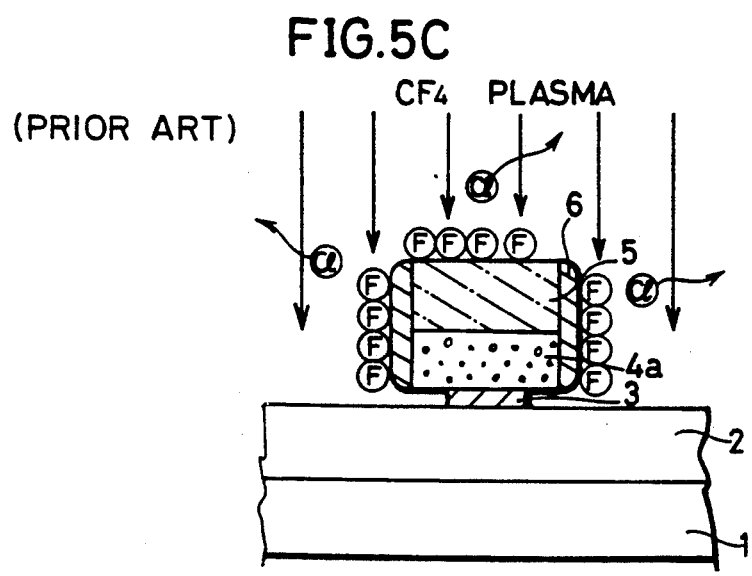

While the description has been given on the case that ultraviolet rays are directed normally to the surface of semiconductor substrate 23 in the foregoing embodiment, with reference to FIG. 2, the present invention is not limited to this. Ultraviolet rays are preferably directed to the side wall of the interconnection pattern, as shown in FIG. 3. More specifically, semiconductor substrate 23 is placed on sample plate 24 so that the surface of the substrate may not be normal to the direction of irradiation of ultraviolet rays. Then, semiconductor substrate 23 is rotated. Thus, directing ultraviolet rays to the side wall of the interconnection pattern results in effective use of ultraviolet rays and a reduction in processing time.

As has been mentioned heretofore, in the interconnection pattern forming method according to the present invention, the interconnection pattern is irradiated with ultraviolet rays in the vacuum of $1 \times 10^{-4}$ Torr or less in degree. By this ultraviolet-ray irradiation step, even if the protection film including halogen is formed on the side wall of the interconnection pattern upon reactive ion etching, the halogen is excited by the ultraviolet-ray energy. This excitation of halogen leads to the cleavage of the coupling between the protection film and halogen and to the separation of halogen from the protection film. In this ultraviolet-ray processing, such inconvenience that the barrier metal is side-etched does not occur as in the convention method employing the plasma of the gas including fluorine. This makes it possible to sufficiently remove the halogen that causes the corrosion of the interconnection pattern in a sufficient time and to perform the complete anti-corrosion processing of the interconnection pattern.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming an interconnection pattern, comprising the steps of:
    forming an interconnection layer on a semiconductor substrate;
    selectively etching said interconnection layer using a gas comprising halogen atoms to form an interconnection pattern and to form on a surface of said interconnection pattern a protection film comprising said halogen atoms; and
    removing said halogen atoms from said interconnection pattern without further etching of said interconnection pattern by irradiating the same with ultraviolet rays in a vacuum of $2 \times 10^{-4}$ Torr or less.

2. The method of claim 1, wherein:
said ultraviolet rays are directed toward a side wall of said interconnection pattern.

3. The method of claim 1, wherein:
the irradiation of said ultraviolet rays is carried out in an atmosphere including fluorine atoms.

4. The method of claim 3, wherein:
said fluorine atoms are present in a gas which comprises $CF_4$.

5. The method of claim 1, wherein:
the irradiation of said ultraviolet rays is carried out in a plasma atmosphere including fluorine atoms.

6. The method of claim 5, wherein:
said fluorine atoms are present in a gas which comprises $CF_4$.

7. The method of claim 1, wherein:
a barrier metal is formed on said semiconductor substrate, and said interconnection layer is formed on said barrier metal.

8. The method of claim 2, wherein
said step of directing said ultraviolet rays toward the side wall of said interconnection pattern comprises
the step of disposing said semiconductor substrate so that a surface of aid semiconductor substrate is at an inclined angle to the direction of irradiation of said ultraviolet rays,
the step of rotating said semiconductor substrate, and
the step of directing said ultraviolet rays toward said interconnection pattern.

9. The method of claim 1, wherein:
said ultraviolet rays comprise light having a wavelength of 300 nm or less.

10. The method of claim 1, wherein:
the irradiation of said ultraviolet rays is carried out in a vacuum of $1 \times 10^{-6}$ Torr or less.

11. The method of claim 1, wherein:
the intensity of irradiation of said ultraviolet rays is more than or equal to 50 mW/cm$^2$.

12. The method of claim 1, wherein
the step of removing further comprises heating said interconnection pattern.

* * * * *